(12) United States Patent
Hsieh

(10) Patent No.: US 12,014,780 B2
(45) Date of Patent: Jun. 18, 2024

(54) MEMORY CIRCUIT, MEMORY DEVICE AND OPERATION METHOD THEREOF

(71) Applicant: National Central University, Taoyuan (TW)

(72) Inventor: E Ray Hsieh, Taoyuan (TW)

(73) Assignee: National Central University, Taoyuan (TW)

( * ) Notice: Subject to any disclaimer, the term of this patent is extended or adjusted under 35 U.S.C. 154(b) by 174 days.

(21) Appl. No.: 17/806,080

(22) Filed: Jun. 9, 2022

(65) Prior Publication Data

US 2022/0399059 A1 Dec. 15, 2022

Related U.S. Application Data

(60) Provisional application No. 63/177,389, filed on Jun. 10, 2021.

(51) Int. Cl.
| | | |
|---|---|---|
| *G11C 16/10* | (2006.01) | |
| *G11C 16/04* | (2006.01) | |
| *G11C 16/08* | (2006.01) | |
| *G11C 16/24* | (2006.01) | |
| *G11C 16/26* | (2006.01) | |
| *G11C 16/32* | (2006.01) | |

(52) U.S. Cl.
CPC ........ *G11C 16/102* (2013.01); *G11C 16/0433* (2013.01); *G11C 16/08* (2013.01); *G11C 16/24* (2013.01); *G11C 16/26* (2013.01); *G11C 16/32* (2013.01)

(58) Field of Classification Search
CPC ............ G11C 13/0002; G11C 13/0009; G11C 13/0071
See application file for complete search history.

(56) References Cited

U.S. PATENT DOCUMENTS

| | | | |
|---|---|---|---|
| 8,320,159 B2 | 11/2012 | Wei et al. | |
| 10,811,092 B1 * | 10/2020 | Lin | ........................ H10B 63/30 |
| 10,957,410 B1 * | 3/2021 | Nazarian | ............. G11C 11/5635 |
| 2021/0151106 A1 | 5/2021 | Wang | |

FOREIGN PATENT DOCUMENTS

| | | | |
|---|---|---|---|
| JP | 2004-234791 A | | 8/2004 |
| JP | 2005259223 A | * | 9/2005 |
| JP | 2008-103055 A | | 5/2008 |
| JP | 2020-155642 A | | 9/2020 |
| TW | 202029195 A | | 8/2020 |
| WO | 2006/046579 A1 | | 5/2006 |

OTHER PUBLICATIONS

JP-2005259223-A (Year: 2005).*

* cited by examiner

*Primary Examiner* — Han Yang
(74) *Attorney, Agent, or Firm* — CKC & Partners Co., LLC

(57) ABSTRACT

The present disclosure provides a memory device, which includes a plurality of electrically bipolar variable memory devices and a storage transistor. The electrically bipolar variable memory devices are electrically connected to a plurality of word lines respectively, the storage transistor is electrically connected to the electrically bipolar variable memory devices, where one end of each of the electrically bipolar variable memory devices is electrically connected to a corresponding one of the word lines, and another end of each of the electrically bipolar variable memory devices is electrically connected to the gate of the storage transistor.

19 Claims, 5 Drawing Sheets

MEMORY CIRCUIT, MEMORY DEVICE AND OPERATION METHOD THEREOF

RELATED APPLICATIONS

This application claims priority to U.S. Provisional Patent Application No. 63/177,389, filed Jun. 10, 2021, the entirety of which is herein incorporated by reference.

BACKGROUND

Field of Invention

The present invention relates to storage circuits and operation methods, and more particularly, a memory circuit, a memory device and an operating method thereof.

Description of Related Art

With the vigorous development of the semiconductor industry, semiconductor components are constantly being introduced. In many application fields, semiconductor memory is widely used in various electronic products.

However, some current memory architectures (e.g., a 3D memory) are difficult to manufacture, have low yields, are costly and are unstable. Therefore, for the above reasons, a new memory device is required to improve performance.

SUMMARY

In one or more various aspects, the present disclosure is directed to a memory circuit, a memory device and an operating method thereof.

One embodiment of the present disclosure is related to a memory device, which includes a plurality of electrically bipolar variable memory devices and a storage transistor. The plurality of electrically bipolar variable memory devices are electrically connected to a plurality of word lines respectively. The storage transistor is electrically connected to the plurality of the electrically bipolar variable memory devices, wherein one end of each of the plurality of the electrically bipolar variable memory devices is electrically connected to a corresponding one of the plurality of the word lines, and another end of each of the plurality of the electrically bipolar variable memory devices is electrically connected to a gate of the storage transistor.

In one embodiment of the present disclosure, a source/drain of the storage transistor is electrically connected to a source line, and another source/drain of the storage transistor is electrically connected to a bit line.

In one embodiment of the present disclosure, the memory device further includes a control transistor. The control transistor is connected the storage transistor in series, wherein a source/drain of the storage transistor is electrically connected to a source line, and another source/drain of the storage transistor is electrically connected to a source/drain of the control transistor, and another source/drain of the control transistor is electrically connected to a bit line.

In one embodiment of the present disclosure, the storage transistor includes the gate and a source/drain and another source/drain. The gate includes the gate comprising one electrically conductive layer or a plurality of electrically conductive layers disposed above one dielectric layer or a plurality of dielectric layers a semiconductor substrate, the gate contacts one end of a gate contact plug, another end of the gate contact plug contacts a metal layer, and the plurality of the electrically bipolar variable memory devices are formed on the metal layer. The source/drain and another source/drain are formed in the semiconductor substrate and positioned at two opposing sides respectively under the gate, and a channel region is positioned between said source/drains under the gate rendering electrical signals.

In one embodiment of the present disclosure, the plurality of the electrically bipolar variable memory devices includes a first contact plug and one or a plurality of first electrically bipolar variable layers. The first contact plug has a bottom being in contact with the metal layer. One side of each of said first electrically bipolar variable layers contacts one side of the first contact plug, each of the plurality of the word lines in parallel and separately contacts another side of each of said first electrically bipolar variable layers, each of said first electrically bipolar variable layers having first regions between said word lines and the first contact plug, and said first region serves as the electrically bipolar variable memory devices.

In one embodiment of the present disclosure, each of said first electrically bipolar variable layers is a bipolar variable resistance layer or a bipolar variable capacitance layer.

In one embodiment of the present disclosure, the source/drain contacts one end of a first source/drain contact plug, another end of the first source/drain contact plug contacts a source line, the another source/drain contacts one end of a second source/drain contact plug, and another end of the second source/drain contact plug is electrically connected to a bit line.

Another embodiment of the present disclosure is related to memory circuit, which includes a plurality of memory devices arranged in an array, and each of the memory devices includes a plurality of electrically bipolar variable memory devices and a storage transistor. The plurality of electrically bipolar variable memory devices are electrically connected to a plurality of word lines respectively. The storage transistor is electrically connected to the plurality of the electrically bipolar variable memory devices, where one end of each of the plurality of the electrically bipolar variable memory devices is electrically connected to a corresponding one of the plurality of the word lines, and another end of each of the plurality of the electrically bipolar variable memory devices is electrically connected to a gate of the storage transistor.

In one embodiment of the present disclosure, a source/drain of the storage transistor is electrically connected to one of a plurality of source lines, and another source/drain of the storage transistor is electrically connected to one of a plurality of bit lines, the plurality of source lines are electrically connected to a source line decoder with a control circuit, the plurality of bit lines are electrically connected to a bit line decoder with a control circuit and a sense circuit, and the plurality of the word lines are electrically connected to a word line decoder with a control circuit.

In one embodiment of the present disclosure, the each of the memory devices includes a control transistor. The control transistor is connected the storage transistor in series, where a source/drain of the storage transistor is electrically connected to one of a plurality of source lines, another source/drain of the storage transistor is electrically connected to a source/drain of the control transistor, another source/drain of the control transistor is electrically connected to one of a plurality of bit lines, a gate of the control transistor is electrically connected to one of a plurality of control lines, the plurality of source lines are electrically connected to a source line decoder with a control circuit, the plurality of bit lines are electrically connected to a bit line decoder with a control circuit, the plurality of word lines are electrically connected to a word line decoder with a control circuit, and the control line is electrically connected to a control line decoder with a control circuit.

Another embodiment of the present disclosure is related to an operation method of a memory device, and the memory device includes a storage transistor and a plurality of electrically bipolar variable memory devices, and the plurality of electrically bipolar variable memory devices are electrically connected to a plurality of word lines respectively. The operation method comprising steps of: when programming one of the plurality of electrically bipolar variable memory devices, applying a programming voltage to a corresponding word line of the plurality of word lines, applying a zero voltage to a bit line, and floating a source line, where one end of each of the plurality of the electrically bipolar variable memory devices is electrically connected to a corresponding one of the plurality of the word lines, another end of each of the plurality of the electrically bipolar variable memory devices is electrically connected to a gate of the storage transistor, a source/drain of the storage transistor is electrically connected to a source line, and another source/drain of the storage transistor is electrically connected to a bit line.

In one embodiment of the present disclosure, the operation method further includes steps of: when erasing the one of the plurality of electrically bipolar variable memory devices, applying the zero voltage to the corresponding word line, applying an erasing voltage to the bit line, and floating the source line.

In one embodiment of the present disclosure, the operation method further includes steps of: when reading the one of the plurality of electrically bipolar variable memory devices, applying a read voltage to the corresponding word line, applying 0.1 times to 1 time of an operation voltage to the bit line, and applying the zero voltage to the source line.

In one embodiment of the present disclosure, the operation method further includes steps of: when the one of the plurality of electrically bipolar variable memory devices is not selected, floating the corresponding word line, and applying the zero voltage to the bit line and the source line.

In one embodiment of the present disclosure, the operation method further includes steps of: when refreshing the one of the plurality of electrically bipolar variable memory devices, periodically programming the one of the plurality of electrically bipolar variable memory devices every predetermined time.

In one embodiment of the present disclosure, the memory device further includes a control transistor connected the storage transistor in series, a source/drain of the storage transistor is electrically connected to the source line, and another source/drain of the storage transistor is electrically connected to a source/drain of the control transistor, and another source/drain of the control transistor is electrically connected to the bit line, a gate of the control transistor is electrically connected to a control line, the step of programming one of the plurality of electrically bipolar variable memory devices includes: applying a voltage greater than or equivalent to an operation voltage to the control line to turn on the control transistor, so that the another source/drain of the storage transistor is electrically connected to the bit line through the control transistor.

In one embodiment of the present disclosure, the operation method further includes steps of: when erasing the one of the plurality of electrically bipolar variable memory devices, applying the voltage greater than or equivalent to the operation voltage to the control line, applying the zero voltage to the corresponding word line, applying an erasing voltage to the bit line, and floating the source line.

In one embodiment of the present disclosure, the operation method further includes steps of: when reading the one of the plurality of electrically bipolar variable memory devices, applying the operation voltage to the control line, applying a read voltage to the corresponding word line, applying 0.1 times to 1 time of the operation voltage to the bit line, and applying the zero voltage to the source line.

In one embodiment of the present disclosure, the operation method further includes steps of: when the one of the plurality of electrically bipolar variable memory devices is not selected, floating the corresponding word lines, and applying the zero voltage to the control lines, the bit lines and the source lines.

In one embodiment of the present disclosure, the operation method further includes steps of: when refreshing the one of the plurality of electrically bipolar variable memory devices, periodically programming the one of the plurality of electrically bipolar variable memory devices every predetermined time.

Technical advantages are generally achieved, by embodiments of the present disclosure. With the technical solution of the present disclosure, the memory device is compatible with the semiconductor manufacturing process, and the three-dimensional structure formed by the plurality of electrically bipolar variable memory devices has stable performance and occupies small spaces.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
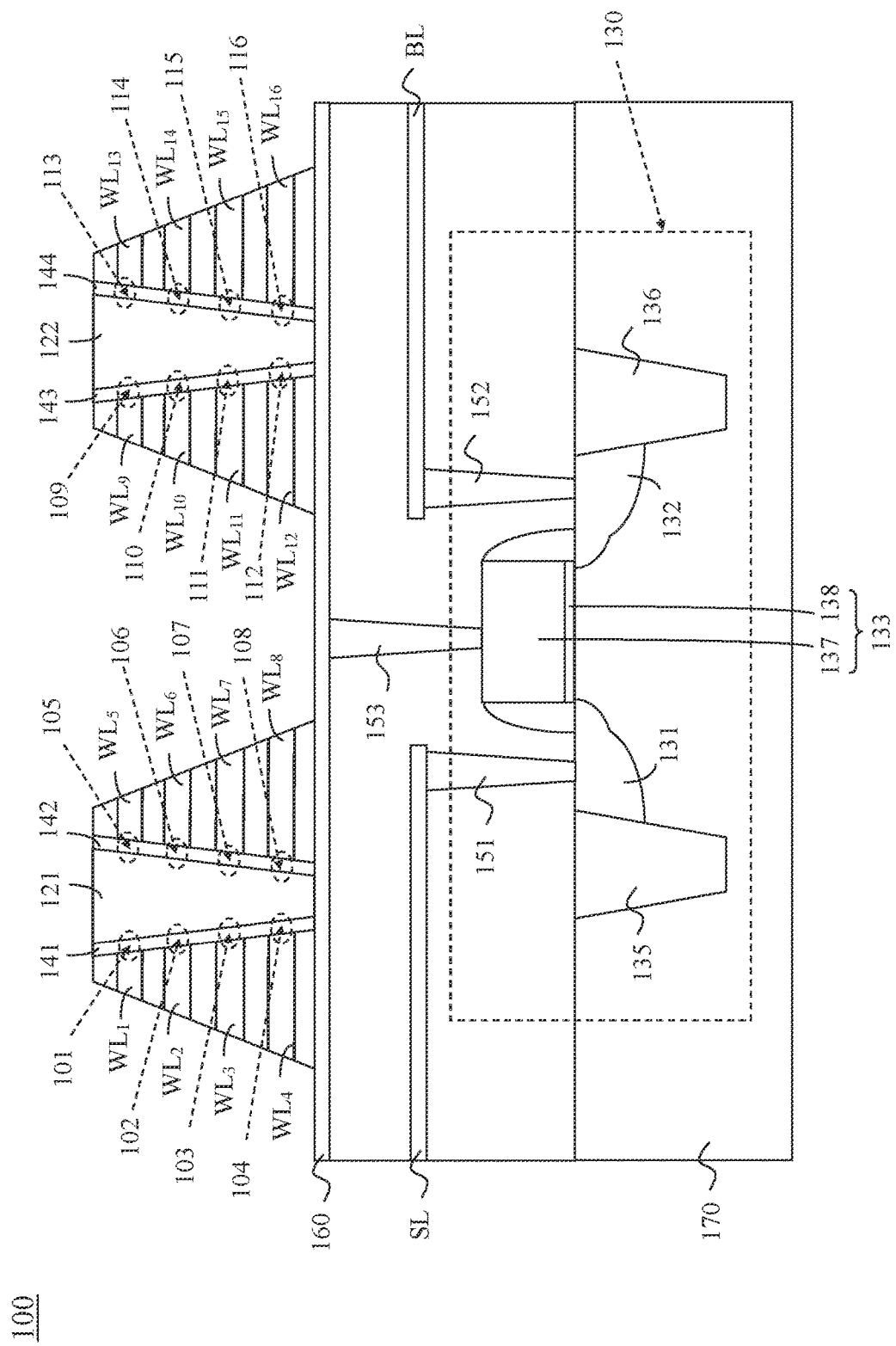
FIG. 1 is a schematic cross-sectional view of a memory device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, in one aspect, the present disclosure is directed to memory device 100. This memory device may be easily integrated into a non-volatile memory or volatile memory and may be applicable or readily adaptable to all technologies. Accordingly, the memory device 100 has advantages. Herewith the memory device 100 is described below with FIG. 1.

The subject disclosure provides the memory device 100 in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a circuit diagram of a memory device 100 according to one embodiment of the present disclosure. As shown in FIG. 1, the memory device 100 includes a plurality of electrically bipolar variable memory devices 101-116 and a storage transistor 130. In structure, the plurality of electrically bipolar variable memory devices 101-116 are electrically connected to a plurality of word lines $WL_1$-$WL_{16}$ respectively, and the storage transistor 130 is electrically connected to the plurality of the electrically bipolar variable memory devices 101-116, where one end of each of the first plurality of the electrically bipolar variable memory devices 101-116 is electrically connected to a corresponding one of the plurality of the word lines $WL_1$-$WL_{16}$, and another end of each of the plurality of the electrically bipolar variable memory devices 101-116 is electrically connected to a gate 133 of the storage transistor 130. In practice, for example, the storage transistor 130 as shown in FIG. 1 can be an nMOSFET; alternatively, the storage transistor 130 can be a pMOSFET. Those skills in the art may flexibly choose a desired architecture depending on the practical application.

In FIG. 1, the storage transistor includes the gate 133 and a source/drain 131 and a source/drain 132, so that a channel region can be positioned between said source/drains 131 and 132 under the gate 133 rendering electrical signals. In structure, the gate 133 is disposed above a semiconductor substrate 170 (e.g., a wafer); for example, the gate 133 includes the gate comprising one electrically conductive layer 137 or a plurality of electrically conductive layers 137 disposed above one dielectric layer 138 or a plurality of dielectric layers 138 disposed above the semiconductor substrate 170. The gate 133 contacts one end of a gate contact plug 153, another end of the gate contact plug 153 contacts a metal layer 160, and the plurality of the electrically bipolar variable memory devices 101-116 are formed on the metal layer 160. The source/drain 131 and the source/drain 132 are formed in the semiconductor substrate 160 and positioned at two opposing sides respectively under the gate 133. The shallow trench isolation 135 is disposed at a side of the source/drain 131, and the shallow trench isolation 136 is disposed at a side of the source/drain 132.

In FIG. 1, the source/drain 131 contacts one end of a first source/drain contact plug 151, another end of the first source/drain contact plug 151 contacts a source line SL, another source/drain 132 contacts one end of a second source/drain contact plug 152, and another end of the second source/drain contact plug 152 is electrically connected to a bit line BL. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. For example, aforesaid another end of the source/drain contact plug 152 is in direct contact with the bit line BL; alternatively, aforesaid another end of the source/drain contact plug 152 is electrically coupled with the bit line BL through a wire and a control transistor indirectly. Those skilled in the art may flexibly choose a desired architecture depending on the practical application.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

For a more complete understanding of three-dimensional stacked structure of the electrically bipolar variable memory devices 101-116, refer to FIG. 1. As shown in FIG. 1, the plurality of the electrically bipolar variable memory devices includes a first contact plug 121, a first electrically bipolar variable layer 141 and a second electrically bipolar variable layer 142. In structure, the first contact plug 121 has a bottom being in contact with the metal layer 160. The first electrically bipolar variable layer 141 has one side contacting one side of the first contact plug 121, a first group of word lines $WL_1$-$WL_4$ laterally contact another side of the first electrically bipolar variable layer 141, isolation layers are disposed among the first group of word lines $WL_1$-$WL_4$, the first electrically bipolar variable layer has a plurality of first regions respectively between the first group of word lines $WL_1$-$WL_4$ and the first contact plug 121, and the plurality of first regions serve as a first set of electrically bipolar variable memory devices 101-104 that are arranged in a three-dimensional stack. The second electrically bipolar variable layer 142 has one side contact another side of the first contact plug 121, a second group of word lines $WL_5$-$WL_8$ laterally contacting another side of the second electrically bipolar variable layer 142, isolation layers are disposed among the second group of word lines $WL_5$-$WL_8$, the second electrically bipolar variable layer 142 has a plurality of second regions respectively between the second group of word lines $WL_5$-$WL_8$ and the first contact plug 121, and the plurality of second regions serve as a second set of electrically bipolar variable memory devices 105-108 that are arranged in a three-dimensional stack. The first and second sets of electrically bipolar variable memory devices 101-104 and 105-108 are formed on both sides of the first contact plug 121 to effectively reduce space.

Similarly, the plurality of the electrically bipolar variable memory devices further includes a second contact plug 122, a third electrically bipolar variable layer 143 and a fourth electrically bipolar variable layer 144. In structure, the second contact plug 122 has a bottom being in contact with the metal layer 160. The third electrically bipolar variable layer 143 has one side contacting one side of the second contact plug 122, a third group of word lines $WL_9$-$WL_{12}$ laterally contact another side of the third electrically bipolar variable layer 143, isolation layers are disposed among the third group of word lines $WL_9$-$WL_{12}$, the third electrically bipolar variable layer 143 has a plurality of third regions respectively between the third group of word lines $WL_9$-$WL_{12}$ and the second contact plug 122, and the plurality of third regions serve as a third set of electrically bipolar variable memory devices 109-112 that are arranged in a three-dimensional stack. The fourth electrically bipolar variable layer 144 has one side contacting another side of the second contact plug 122, a fourth group of word lines $WL_{13}$-$WL_{16}$ laterally contact another side of the fourth electrically bipolar variable layer 144, isolation layers are disposed among the fourth group of word lines $WL_{13}$-$WL_{16}$, the fourth electrically bipolar variable layer 144 has a plurality of fourth regions respectively between the fourth group of word lines $WL_{13}$-$WL_{16}$ and the second contact plug 122, and the plurality of fourth regions serving as a fourth set of electrically bipolar variable memory devices 113-116 that are arranged in a three-dimensional stack. The third and fourth sets of electrically bipolar variable memory devices 109-112 and 113-116 are formed on both sides of the second contact plug 122 to effectively reduce space.

In practice, for example, each of the first electrically bipolar variable layer 141, the second electrically bipolar variable layer 142, the third electrically bipolar variable layer 143 and the fourth electrically bipolar variable layer 144 can be a bipolar variable resistance layer, a bipolar variable capacitance layer (e.g., a ferroelectric layer) and/or another material with electrically bipolar variable characteristics.

Figure 2:
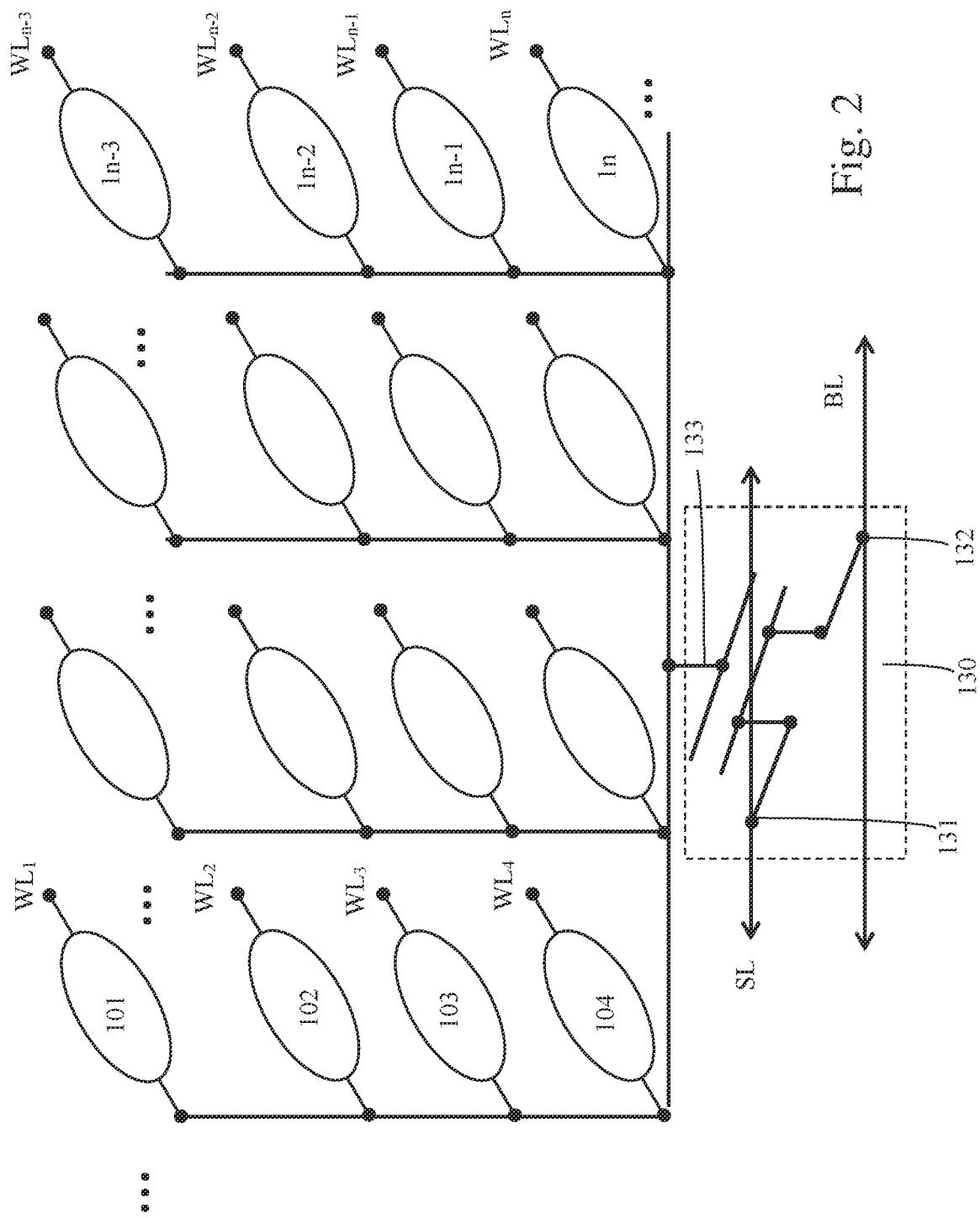
FIG. 2 is an equivalent circuit diagram of a memory device according to one embodiment of the present disclosure.

FIG. 2 is an equivalent circuit diagram of a memory device 200 according to one embodiment of the present disclosure. The memory device 200 is substantially the same as the memory device 100, except that the memory device 200 uses the three-dimensional stacked structure of FIG. 1 to derive n electrically bipolar variable memory devices, where n can be, for example, a positive integer greater than or equal to 16.

In FIG. 2, the source/drain 131 of the storage transistor 130 is electrically connected to the source line SL, and the source/drain 132 of the storage transistor 130 is electrically connected the bit line BL.

As to the operation method of the memory device 200, each electrically bipolar variable memory device can be programmed, erased, read, and/or refreshed. The electrically bipolar variable memory device 101 in FIG. 2 is taken as an example below, and the other electrically bipolar variable memory devices can be deduced by analogy.

When the electrically bipolar variable memory device 101 is programmed, a programming voltage is applied to the word line $WL_1$, a zero voltage is applied to the bit line BL, and the source line SL is floated.

When the electrically bipolar variable memory device 101 is erased, the zero voltage is applied to the word line $WL_1$, an erasing voltage is applied to the bit line BL, and the source line SL is floated. In this way, the paths of applying the erasing voltage and the program voltage are opposite, thereby improving the stability of the operation.

When the electrically bipolar variable memory device 101 is read, a read voltage is applied to the word line $WL_1$, about 0.1 times to 1 time of an operation voltage is applied to the bit line BL, and the zero voltage is applied to the source line SL. The storage state of the electrically bipolar variable memory device 101 is determined by sensing the current signal outputted from the electrically bipolar variable memory device 101.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

When the electrically bipolar variable memory device 101 is not selected, the word line $WL_1$ is floated, and the zero voltage is applied to the bit line BL and the source line SL.

When the electrically bipolar variable memory device 101 is refreshed, the electrically bipolar variable memory device 101 is periodically programmed every predetermined time (e.g., a time range of about one microsecond to one minute). In practice, for example, the electrically bipolar variable memory device 101 serves as a volatile memory needs an additional "refresh" operation in addition to the original three operations of programming, erasing, and reading operations. The refresh operation means that in the volatile memory, the information stored in the volatile memory will pass over time, and it is necessary to periodically rewrite the information back to the electrically bipolar variable memory device 101 in the memory cell within a predetermined time to maintain the electrical properties of the original stored information, so as to prevent the information stored in the electrically bipolar variable memory device 101 from being lost.

Figure 3:
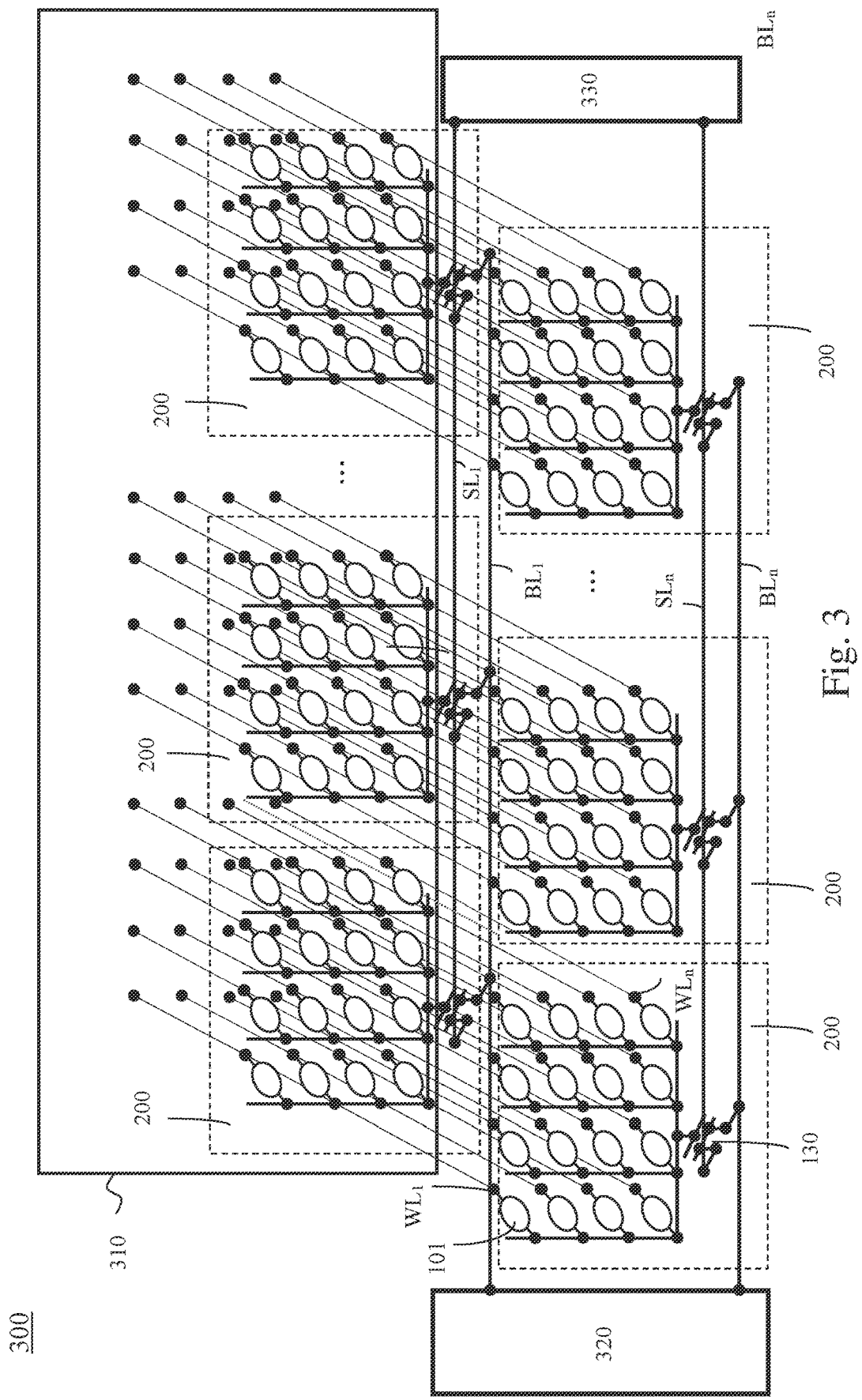
FIG. 3 is an equivalent circuit diagram of a memory circuit according to one embodiment of the present disclosure.

FIG. 3 is an equivalent circuit diagram of a memory circuit 300 according to one embodiment of the present disclosure. As shown in FIG. 3, a plurality of the memory devices 200 of FIG. 2, and the memory devices 200 are arranged in an array.

In FIG. 3, the source lines $SL_1$ and $SL_n$ are electrically connected to a source line decoder with a control circuit 330, the bit lines $BL_1$ and $BL_n$ are electrically connected to a bit line decoder with a control circuit and a sense circuit 320, and the plurality of the word lines $WL_1$-$WL_{16}$ are electrically connected to a word line decoder with a control circuit 310.

As to the operation method of the memory circuit 300, each electrically bipolar variable memory device can be programmed, erased, read, and/or refreshed. The electrically bipolar variable memory device 101 in FIG. 3 is taken as an example below, and the other electrically bipolar variable memory devices can be deduced by analogy.

When programming the electrically bipolar variable memory device 101, the word line decoder with the control circuit 310 applied the programming voltage to the word line $WL_1$, the bit line decoder with the control circuit and the sense circuit 320 applies the zero voltage to the bit line $BL_n$, and the source line decoder with the control circuit 330 floats the source line $SL_n$.

When erasing the electrically bipolar variable memory device 101, the word line decoder with the control circuit 310 applied the zero voltage to the word line $WL_1$, the bit line decoder with the control circuit and the sense circuit 320 applies the erasing voltage to the bit line $BL_n$, and the source line decoder with the control circuit 330 floats the source line $SL_n$. In this way, the paths of applying the erasing voltage and the program voltage are opposite, thereby improving the stability of the operation.

When reading the electrically bipolar variable memory device 101, the word line decoder with a control circuit 310 applied the read voltage to the word line $WL_1$, the bit line decoder with the control circuit and the sense circuit 320 applies about 0.1 times to 1 time of the operation voltage to the bit line $BL_n$, and the source line decoder with the control circuit 330 applies the zero voltage to the source line $SL_n$. The bit line decoder with the control circuit and the sense circuit 320 senses the current signal outputted from the electrically bipolar variable memory device 101 so as to determine the storage state of the electrically bipolar variable memory device 101.

When the electrically bipolar variable memory device 101 is not selected, the word line decoder with a control circuit 310 floats the word line $WL_1$, and the bit line decoder with the control circuit and the sense circuit 320 and the source line decoder with the control circuit 330 apply the zero voltage to the bit line $BL_n$ and the source line $SL_n$ respectively.

When refreshing the electrically bipolar variable memory device 101, the word line decoder with a control circuit 310, the bit line decoder with the control circuit and the sense circuit 320 and the source line decoder with the control circuit 330 periodically programs the electrically bipolar variable memory device 101 every predetermined time (e.g., a time range of about one microsecond to one minute).

Figure 4:
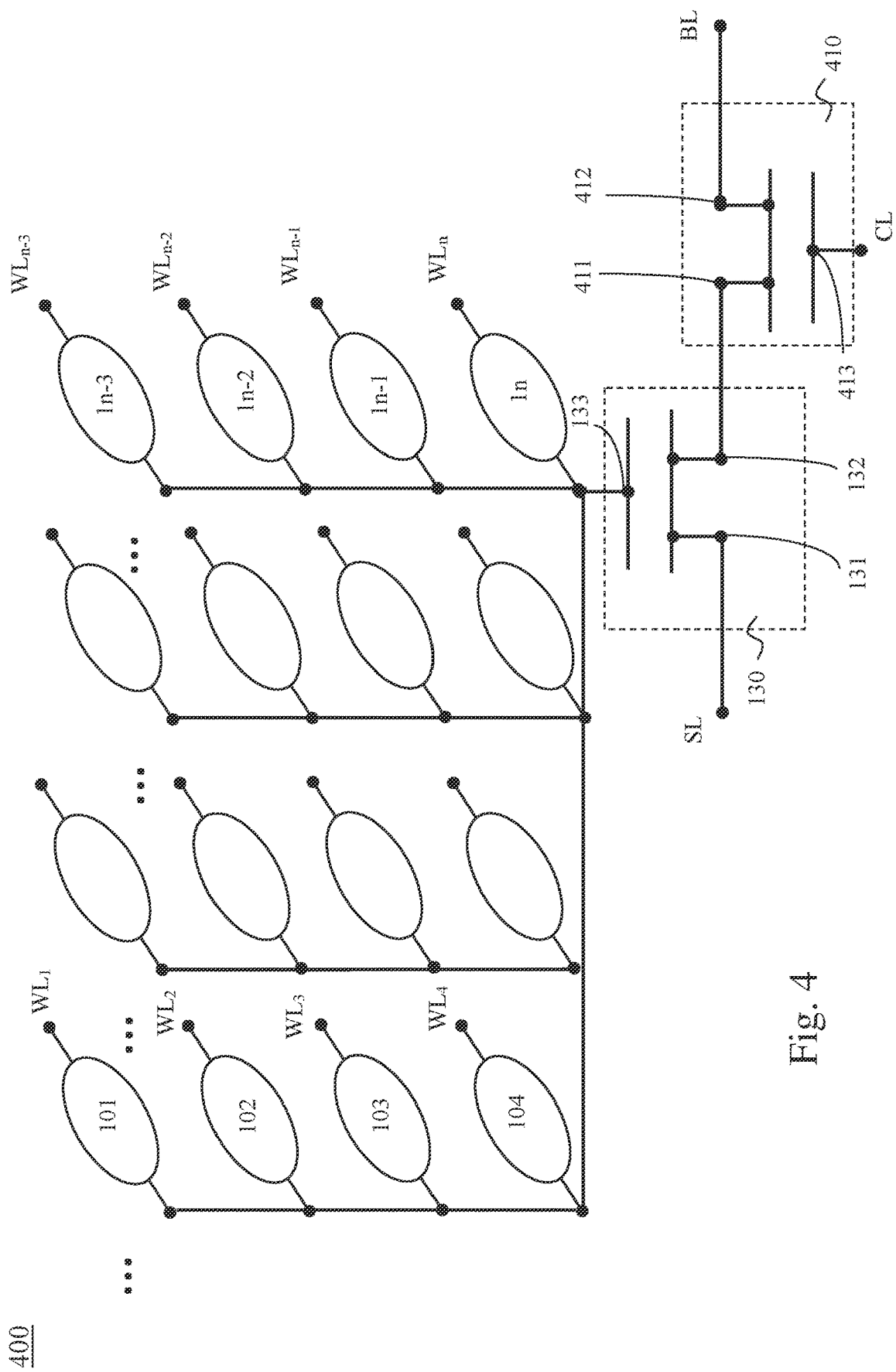
FIG. 4 is an equivalent circuit diagram of a memory device according to another embodiment of the present disclosure.

FIG. 4 is an equivalent circuit diagram of a memory device 400 according to another embodiment of the present disclosure. The memory device 400 is substantially the same as the memory device 200, except that the memory device 400 further includes a control transistor 410.

In FIG. 4, the control transistor 410 is connected the storage transistor 130 in series, wherein the source/drain 131 of the storage transistor 130 is electrically connected to the source line SL, and the source/drain 132 of the storage transistor 130 is electrically connected to a source/drain 411 of the control transistor 410, a source/drain 412 of the control transistor 410 is electrically connected to the bit line BL, and a gate of the control transistor 410 is electrically connected to a control line CL. Through the control transistor 410, the switching speed can be accelerated, the operation stability can be maintained, and the leakage current can be effectively prevented.

As to the operation method of the memory device 400, each electrically bipolar variable memory device can be programmed, erased, read, and/or refreshed. The electrically bipolar variable memory device 101 in FIG. 4 is taken as an example below, and the other electrically bipolar variable memory devices can be deduced by analogy.

When the electrically bipolar variable memory device 101 is programmed, a voltage greater or equivalent to than the operation voltage (e.g., VDD) is applied to the control line CL, the programming voltage is applied to the word line $WL_1$, the zero voltage is applied to the bit line BL, and the source line SL is floated, so that the control transistor is turned on, the source/drain 132 of the storage transistor 130 is electrically connected to the bit line BL through the control transistor 410.

When the electrically bipolar variable memory device 101 is erased, the voltage greater or equivalent to than the operation voltage is applied to the control line CL, the zero voltage is applied to the word line $WL_1$, the erasing voltage is applied to the bit line BL, and the source line SL is floated.

When the electrically bipolar variable memory device 101 is read, the operation voltage is applied to the control line CL, the read voltage is applied to the word line $WL_1$, about 0.1 times to 1 time of the operation voltage is applied to the bit line BL, and the zero voltage is applied to the source line SL.

When the electrically bipolar variable memory device 101 is not selected, the word line $WL_1$ is floated, and the zero voltage is applied to the control line CL, the bit line BL and the source line SL. Regardless of whether each electrically bipolar variable memory device is programmed or not, the control transistor 410 is kept in an off state, thereby effectively preventing leakage current.

When the electrically bipolar variable memory device 101 is refreshed, the electrically bipolar variable memory device 101 is periodically programmed every predetermined time.

Under the arrangement of the control transistor connected to the storage transistor, when programming, erasing, reading, and refreshing the selected electrically variable storage device 101, the control line CL can be provided with about 1 time to 1.5 times of the operation voltage.

Figure 5:
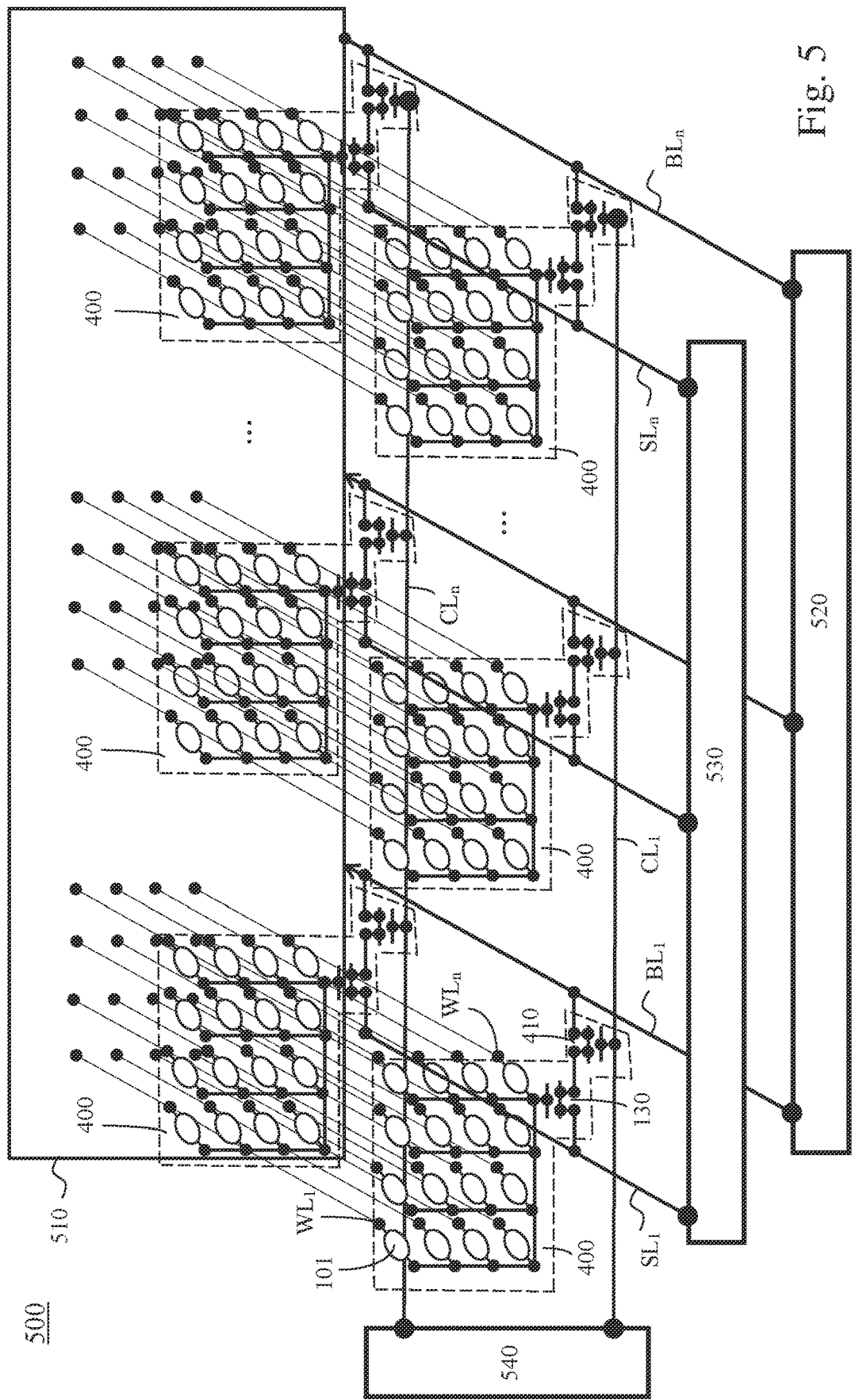
FIG. 5 is an equivalent circuit diagram of a memory circuit according to another embodiment of the present disclosure.

FIG. 5 is an equivalent circuit diagram of a memory circuit 500 according to another embodiment of the present disclosure. As shown in FIG. 5, a plurality of the memory devices 400 of FIG. 4, and the memory devices 400 are arranged in an array.

In FIG. 5, the source lines $SL_1$ and $SL_n$ are electrically connected to a source line decoder with a control circuit 530, the bit lines $BL_1$ and $BL_n$ are electrically connected to a bit line decoder with a control circuit 520 (e.g., the bit line decoder with the control circuit and a sense circuit), and the plurality of the word lines $WL_1$-$WL_{16}$ are electrically connected to a word line decoder with a control circuit 510, and the control lines $CL_1$ and $CL_n$ are electrically connected to a control line decoder with a control circuit 540.

As to the operation method of the memory circuit 500, each electrically bipolar variable memory device can be programmed, erased, read, and/or refreshed. The electrically bipolar variable memory device 101 in FIG. 5 is taken as an example below, and the other electrically bipolar variable memory devices can be deduced by analogy.

When programming the electrically bipolar variable memory device 101, the control line decoder with the control circuit 540 applied the voltage greater than or equivalent to the operation voltage (e.g., VDD) to the control line $CL_1$, the word line decoder with the control circuit 510 applied the programming voltage to the word line $WL_1$, the bit line decoder with the control circuit 520 applies the zero voltage to the bit line $BL_1$, and the source line decoder with the control circuit 530 floats the source line $SL_1$.

When erasing the electrically bipolar variable memory device 101, the control line decoder with the control circuit 540 applied the voltage greater than or equivalent to the operation voltage to the control line $CL_1$, the word line decoder with the control circuit 510 applied the zero voltage to the word line $WL_1$, the bit line decoder with the control circuit 520 applies the erasing voltage to the bit line $BL_1$, and the source line decoder with the control circuit 530 floats the source line $SL_1$.

When reading the electrically bipolar variable memory device 101, the control line decoder with the control circuit 540 applied the operation voltage to the control line $CL_1$, the word line decoder with the control circuit 510 applied the read voltage to the word line $WL_1$, the bit line decoder with the control circuit 520 applies about 0.1 times to 1 time of the operation voltage to the bit line $BL_1$, and the source line decoder with the control circuit 530 applies the zero voltage to the source line $SL_1$.

When the electrically bipolar variable memory device 101 is not selected, the word line decoder with a control circuit 510 floats the word line $WL_1$, and the control line decoder with the control circuit 540, the bit line decoder with the control circuit 520 and the source line decoder with the control circuit 530 applied the zero voltage to the control line $CL_1$, the bit line $BL_1$ and the source line $SL_1$ respectively. Regardless of whether each electrically bipolar variable memory device 101 is programmed or not, the control transistor 410 is kept in an off state, thereby effectively preventing leakage current.

When refreshing the electrically bipolar variable memory device 101, the word line decoder with a control circuit 510, the bit line decoder with the control circuit 520 and the source line decoder with the control circuit 530 periodically programs the electrically bipolar variable memory device 101 every predetermined time.

In view of the above, technical advantages are generally achieved, by embodiments of the present disclosure. With the technical solution of the present disclosure, the memory devices 100, 200 and 400 are compatible with the semiconductor manufacturing process, and the three-dimensional structure formed by the plurality of electrically bipolar variable memory devices has stable performance and occupies small spaces.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory device, comprising:
   a plurality of electrically bipolar variable memory devices electrically connected to a plurality of word lines respectively; and
   a storage transistor electrically connected to the plurality of the electrically bipolar variable memory devices, wherein one end of each of the plurality of the electrically bipolar variable memory devices is electrically connected to a corresponding one of the plurality of the word lines, and another end of each of the plurality of the electrically bipolar variable memory devices is electrically connected to a gate of the storage transistor,
   wherein the storage transistor comprises: the gate comprising one electrically conductive layer or a plurality of electrically conductive layers disposed above one dielectric layer or a plurality of dielectric layers disposed above a semiconductor substrate, the gate contacting one end of a gate contact plug, another end of the gate contact plug contacting a metal layer, and the plurality of the electrically bipolar variable memory devices formed on the metal layer; and a source/drain and another source/drain formed in the semiconductor substrate, and a channel region positioned between said source/drains under the gate rendering electrical signals.

2. The memory device of claim 1, wherein a source/drain of the storage transistor is electrically connected to a source line, and another source/drain of the storage transistor is electrically connected to a bit line.

3. The memory device of claim 1, further comprising:
   a control transistor connected the storage transistor in series, wherein a source/drain of the storage transistor is electrically connected to a source line, and another source/drain of the storage transistor is electrically connected to a source/drain of the control transistor, and another source/drain of the control transistor is electrically connected to a bit line.

4. The memory device of claim 1, wherein the plurality of the electrically bipolar variable memory devices comprises:
   a first contact plug having a bottom being in contact with the metal layer; and
   one or a plurality of first electrically bipolar variable layers, wherein one side of each of said first electrically bipolar variable layers contacts one side of the first contact plug, each of the plurality of the word lines in parallel and separately contacts another side of each of said first electrically bipolar variable layers, each of said first electrically bipolar variable layers has first regions between said word lines and the first contact plug, and said first regions serves as the electrically bipolar variable memory devices.

5. The memory device of claim 4, wherein each of said first electrically bipolar variable layers is a bipolar variable resistance layer or a bipolar variable capacitance layer.

6. The memory device of claim 1, wherein the source/drain contacts one end of a first source/drain contact plug, another end of the first source/drain contact plug contacts a source line, the another source/drain contacts one end of a second source/drain contact plug, and another end of the second source/drain contact plug is electrically connected to a bit line.

7. A memory circuit, comprising:
   a plurality of memory devices arranged in an array, each of the memory devices comprising:
   a plurality of electrically bipolar variable memory devices electrically connected to a plurality of word lines respectively; and
   a storage transistor electrically connected to the plurality of the electrically bipolar variable memory devices, wherein one end of each of the plurality of the electrically bipolar variable memory devices is electrically connected to a corresponding one of the word lines, and another end of each of the plurality of the electrically bipolar variable memory devices is electrically connected to a gate of the storage transistor,
   wherein the storage transistor comprises: the gate comprising one electrically conductive layer or a plurality of electrically conductive layers disposed above one dielectric layer or a plurality of dielectric layers disposed above a semiconductor substrate, the gate contacting one end of a gate contact plug, another end of the gate contact plug contacting a metal layer, and the plurality of the electrically bipolar variable memory devices formed on the metal layer; and a source/drain and another source/drain formed in the semiconductor substrate, and a channel region positioned between said source/drains under the gate rendering electrical signals.

8. The memory circuit of claim 7, wherein a source/drain of the storage transistor is electrically connected to one of a plurality of source lines, and another source/drain of the storage transistor is electrically connected to one of a plurality of bit lines, the plurality of source lines are electrically connected to a source line decoder with a control circuit, the plurality of bit lines are electrically connected to a bit line decoder with a control circuit and a sense circuit, and the plurality of the word lines are electrically connected to a word line decoder with a control circuit.

9. The memory circuit of claim 7, wherein the each of the memory devices comprises:
   a control transistor connected the storage transistor in series, wherein a source/drain of the storage transistor is electrically connected to one of a plurality of source lines, another source/drain of the storage transistor is electrically connected to a source/drain of the control transistor, another source/drain of the control transistor is electrically connected to one of a plurality of bit lines, a gate of the control transistor is electrically connected to one of a plurality of control lines, the plurality of source lines are electrically connected to a source line decoder with a control circuit, the plurality of bit lines are electrically connected to a bit line decoder with a control circuit, the plurality of word lines are electrically connected to a word line decoder with a control circuit, and the plurality of control lines are electrically connected to a control line decoder with a control circuit.

10. An operation method of a memory device, the memory device comprising a storage transistor and a plurality of electrically bipolar variable memory devices, the plurality of electrically bipolar variable memory devices electrically connected to a plurality of word lines respectively, and the operation method comprising steps of:

when programming one of the plurality of electrically bipolar variable memory devices, applying a programming voltage to a corresponding word line of the plurality of word lines, applying a zero voltage to a bit line, and floating a source line, wherein one end of each of the plurality of the electrically bipolar variable memory devices is electrically connected to a corresponding one of the plurality of the word lines, another end of each of the plurality of the electrically bipolar variable memory devices is electrically connected to a gate of the storage transistor, a source/drain of the storage transistor is electrically connected to the source line, and another source/drain of the storage transistor is electrically connected to the bit line.

11. The operation method of claim 10, further comprising:

when erasing the one of the plurality of electrically bipolar variable memory devices, applying the zero voltage to the corresponding word line, applying an erasing voltage to the bit line, and floating the source line.

12. The operation method of claim 10, further comprising:

when reading the one of the plurality of electrically bipolar variable memory devices, applying a read voltage to the corresponding word line, applying 0.1 times to 1 time of an operation voltage to the bit line, and applying the zero voltage to the source line.

13. The operation method of claim 10, further comprising:

when the one of the plurality of electrically bipolar variable memory devices is not selected, floating the corresponding word line, and applying the zero voltage to the bit line and the source line.

14. The operation method of claim 10, further comprising:

when refreshing the one of the plurality of electrically bipolar variable memory devices, periodically programming the one of the plurality of electrically bipolar variable memory devices every predetermined time.

15. The operation method of claim 10, wherein the memory device further comprises a control transistor connected the storage transistor in series, a source/drain of the storage transistor is electrically connected to the source line, and another source/drain of the storage transistor is electrically connected to a source/drain of the control transistor, and another source/drain of the control transistor is electrically connected to the bit line, a gate of the control transistor is electrically connected to a control line, the step of programming one of the plurality of electrically bipolar variable memory devices comprises:

applying a voltage greater than or equivalent to an operation voltage to the control line to turn on the control transistor, so that the another source/drain of the storage transistor is electrically connected to the bit line through the control transistor.

16. The operation method of claim 15, further comprising:

when erasing the one of the plurality of electrically bipolar variable memory devices, applying the voltage greater than or equivalent to the operation voltage to the control line, applying the zero voltage to the corresponding word line, applying an erasing voltage to the bit line, and floating the source line.

17. The operation method of claim 15, further comprising:

when reading the one of the plurality of electrically bipolar variable memory devices, applying the operation voltage to the control line, applying a read voltage to the corresponding word line, applying 0.1 times to 1 time of the operation voltage to the bit line, and applying the zero voltage to the source line.

18. The operation method of claim 15, further comprising:

when the one of the plurality of electrically bipolar variable memory devices is not selected, floating the corresponding word line, and applying the zero voltage to the control line, the bit line and the source line.

19. The operation method of claim 15, further comprising:

when refreshing the one of the plurality of electrically bipolar variable memory devices, periodically programming the one of the plurality of electrically bipolar variable memory devices every predetermined time.

\* \* \* \* \*